United States Patent
Chang et al.

(10) Patent No.: US 9,490,136 B1
(45) Date of Patent: Nov. 8, 2016

(54) METHOD OF FORMING TRENCH CUT

(71) Applicant: Taiwan Semiconductor Manufacturing Company, Ltd., Hsin-Chu (TW)

(72) Inventors: Yu-Sheng Chang, Taipei (TW); Chia-Tien Wu, Taichung (TW); Yung-Hsu Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/840,199

(22) Filed: Aug. 31, 2015

(51) Int. Cl.
*H01L 21/308* (2006.01)

(52) U.S. Cl.
CPC ....... *H01L 21/3086* (2013.01); *H01L 21/3085* (2013.01); *H01L 21/3088* (2013.01)

(58) Field of Classification Search
None
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2008/0026327 A1* | 1/2008 | Koo | G03F 7/0035 430/312 |
| 2008/0131793 A1* | 6/2008 | Lee | H01L 21/0337 430/5 |
| 2012/0108070 A1* | 5/2012 | Kim | H01L 21/3086 438/703 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0093902 A1* | 4/2015 | Huang | H01L 21/0337 438/703 |
| 2015/0162205 A1* | 6/2015 | Wu | H01L 21/3086 438/618 |

OTHER PUBLICATIONS

Mark Somervell et al., "Comparison of Directed Self-Assembly Integrations," Proc. of SPIE vol. 8325, 83250G, (2012), 15 pages, Advances in Resist Materials and Processing Technology XXiX.

* cited by examiner

*Primary Examiner* — Anita Alanko
(74) *Attorney, Agent, or Firm* — Haynes and Boone, LLP

(57) ABSTRACT

A method includes forming a hard mask (HM) stack over a material layer, which has a first, second, third and fourth HM layers. The method also includes forming a first trench in the fourth HM layer, forming a first spacer in the first trench, forming a second trench in the fourth HM layer, removing at least a portion of the first spacer to form a cut by using the third HM layer as an etch-stop layer, removing a portion of the third HM layer and the second HM layer exposed by the first trench, second trench, and cut to form an extended first trench, extended second trench, and extended cut, respectively. The method also includes forming second spacers in the extended first trench, the extended second trench, and the extended cut and removing another portion of the second HM layer to form a third trench.

20 Claims, 21 Drawing Sheets

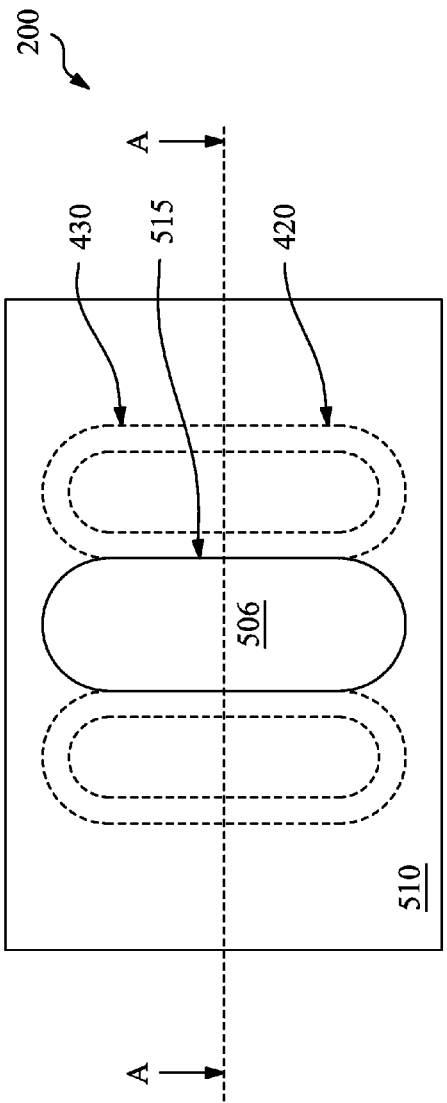
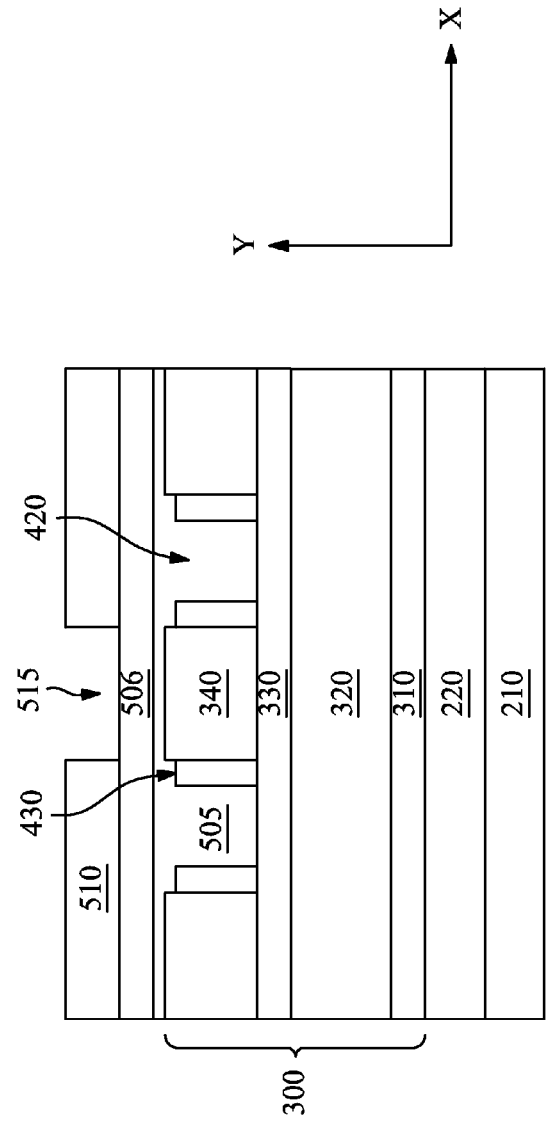
FIG. 6A
FIG. 6B

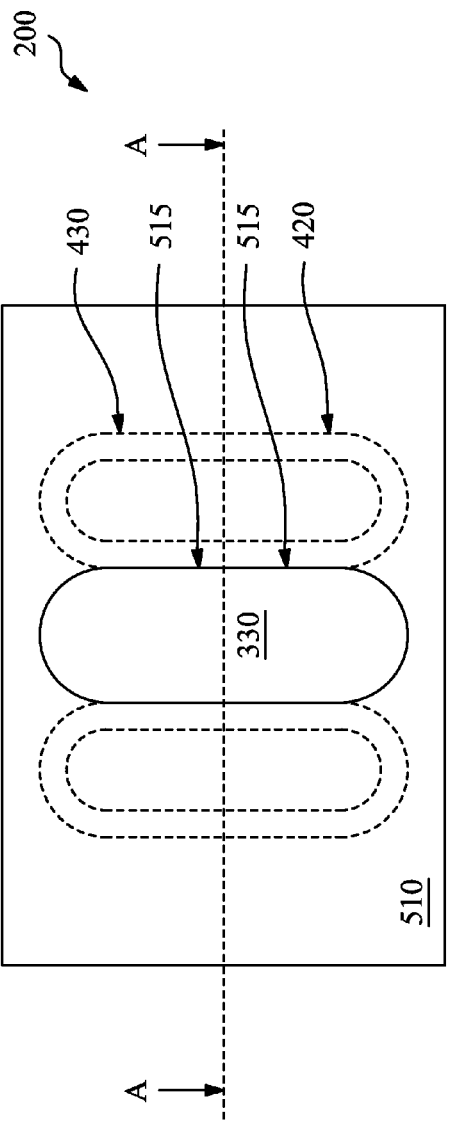
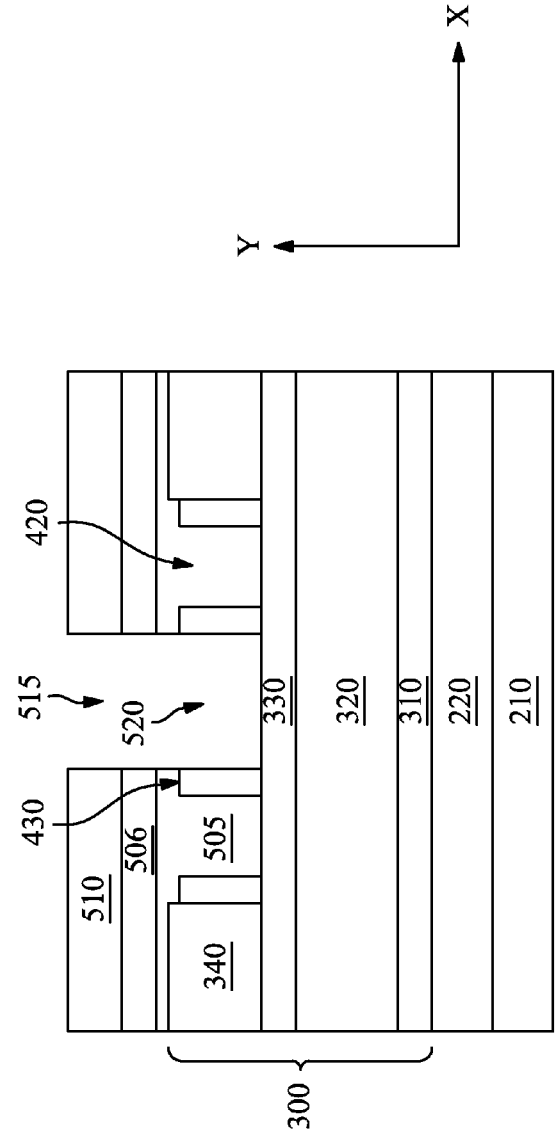
FIG. 7A
FIG. 7B

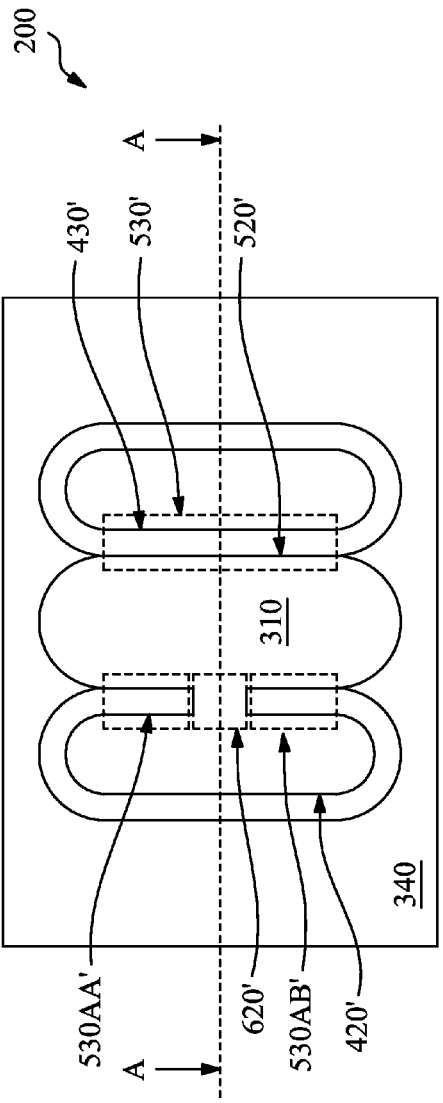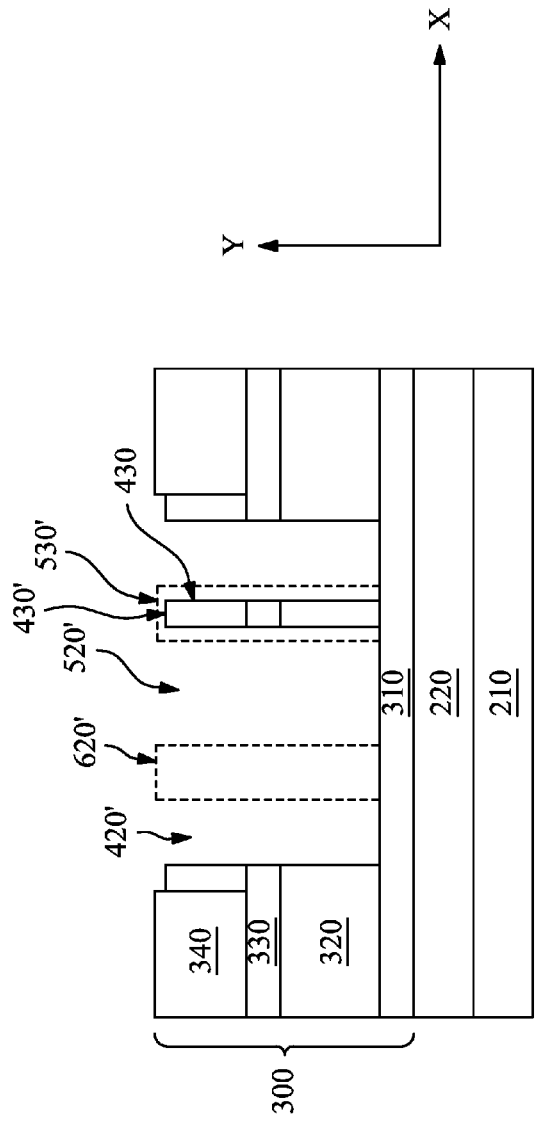
FIG. 10A
FIG. 10B

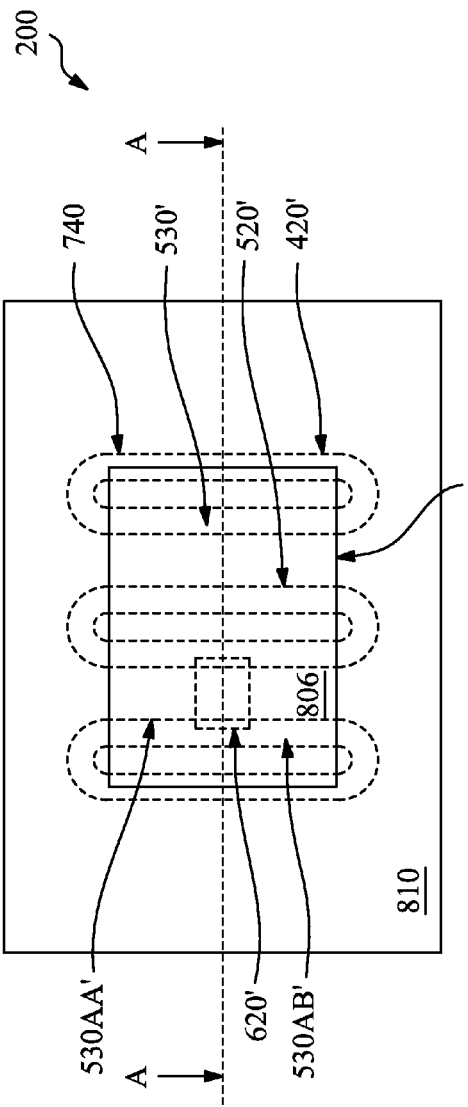
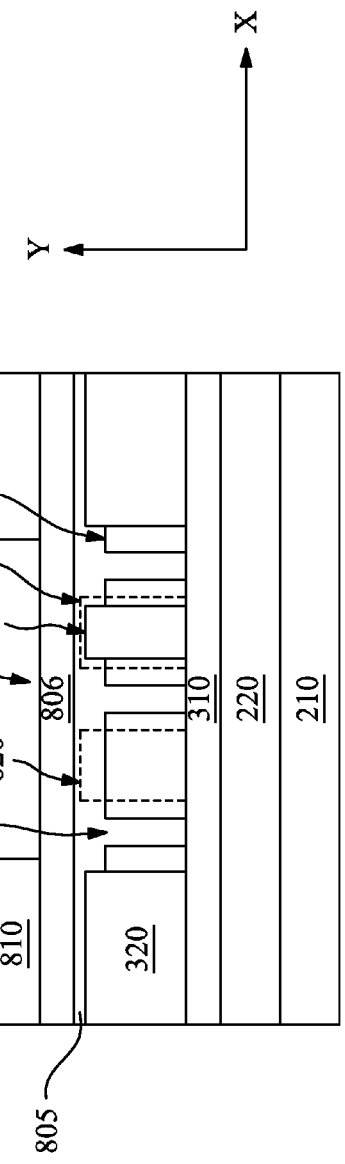
FIG. 13A
FIG. 13B

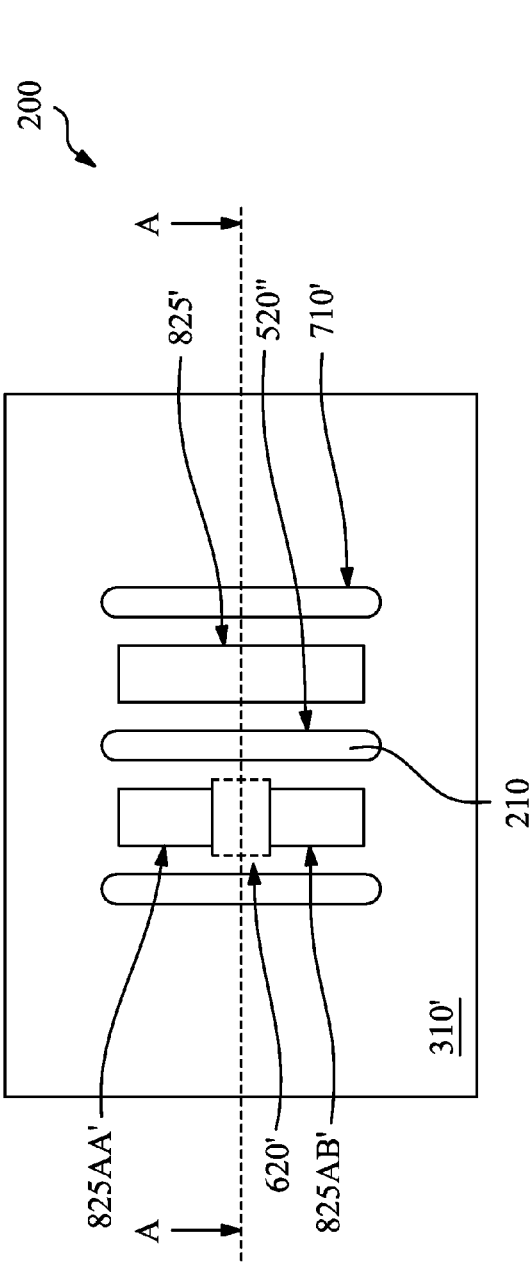
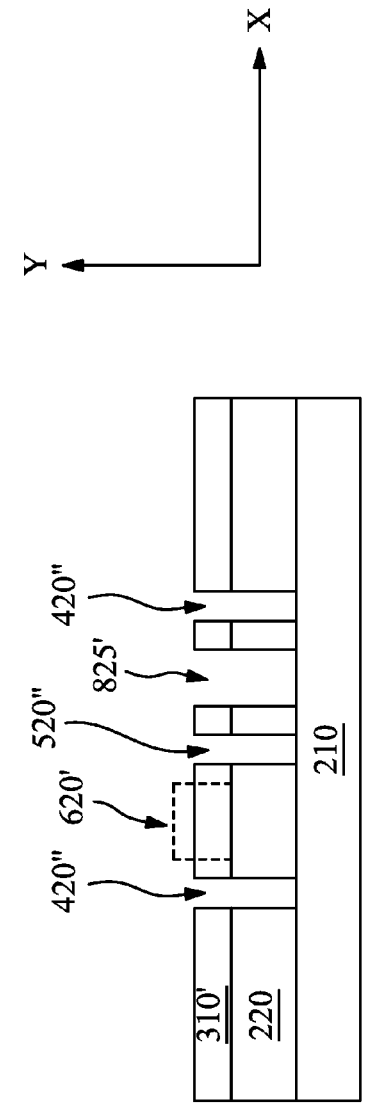
FIG. 16A
FIG. 16B

METHOD OF FORMING TRENCH CUT

BACKGROUND

The semiconductor integrated circuit (IC) industry has experienced rapid growth. Technological advances in IC design and materials have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play an important role in IC performance. Although existing methods of fabricating IC devices have been generally adequate for their intended purposes, they have not been entirely satisfactory in all respects. For example, challenges rise in forming trenches and then cutting a trench into sub-trenches during the fabrication of IC devices.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 3A, 4A, 4C, 5A, 6A, 7A, 7C, 8A, 9A, 9C, 10A, 11A, 12A, 13A, 14A, 14C, 15A, 15C and 16A are top views of an example of a semiconductor device in accordance with some embodiments FIGS. 3B, 4B, 4D, 5B, 6B, 7B, 7D, 8B, 9B, 9D, 10B, 11B, 12B, 13B, 14B, 14D, 15B, 15D and 16B are cross-sectional views of an example semiconductor device in accordance with some embodiments, along the line A-A in FIGS. 3A, 4A, 4C, 5A, 6A, 7A, 7C, 8A, 9A, 9C, 10A, 11A, 12A, 13A, 14A, 14C, 15A, 15C and 16A, respectively.

DETAILED DESCRIPTION

Figure 1:
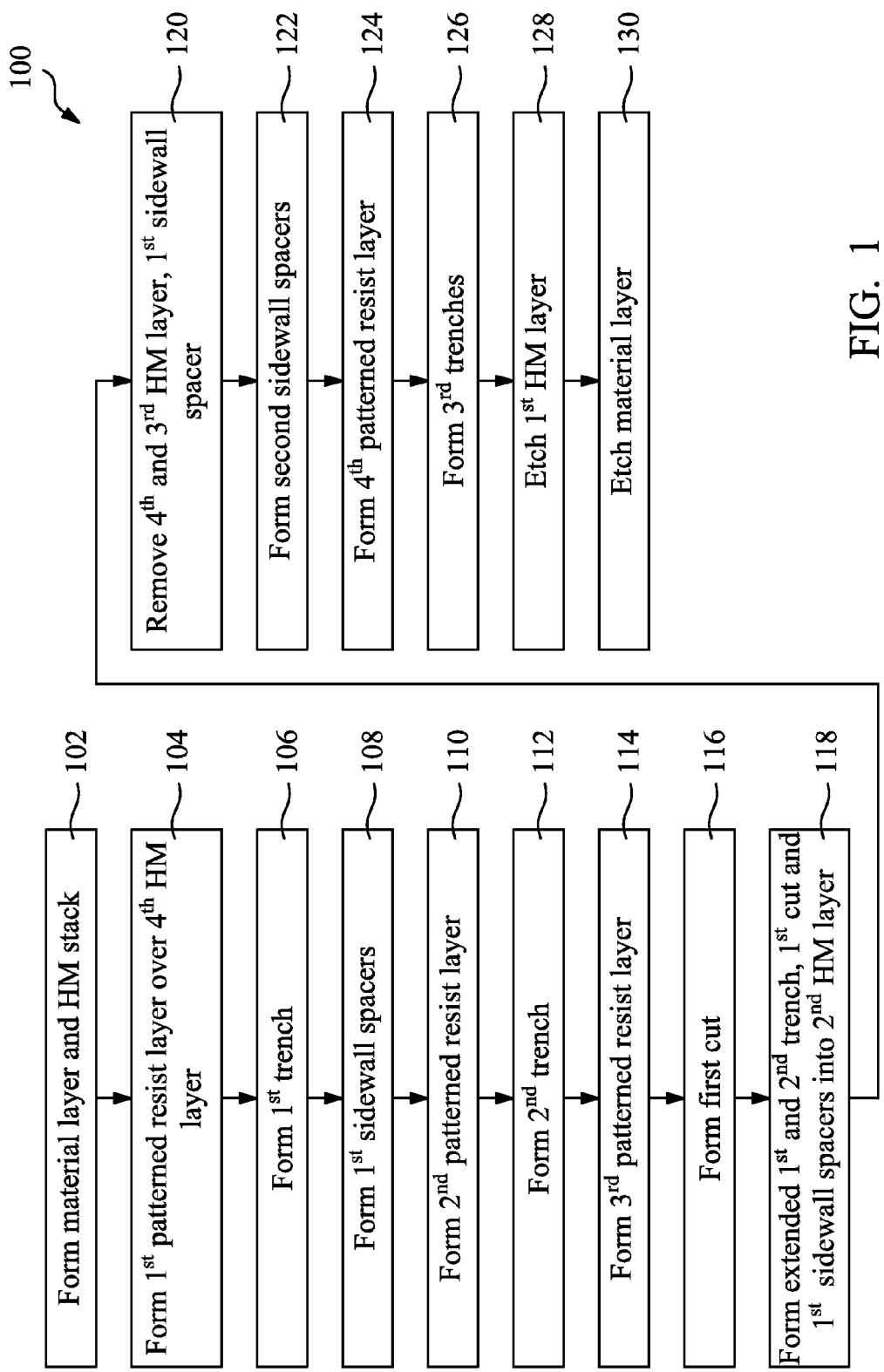
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below with reference to a semiconductor device 200, shown in FIGS. 2 through 16B.

Figure 2:
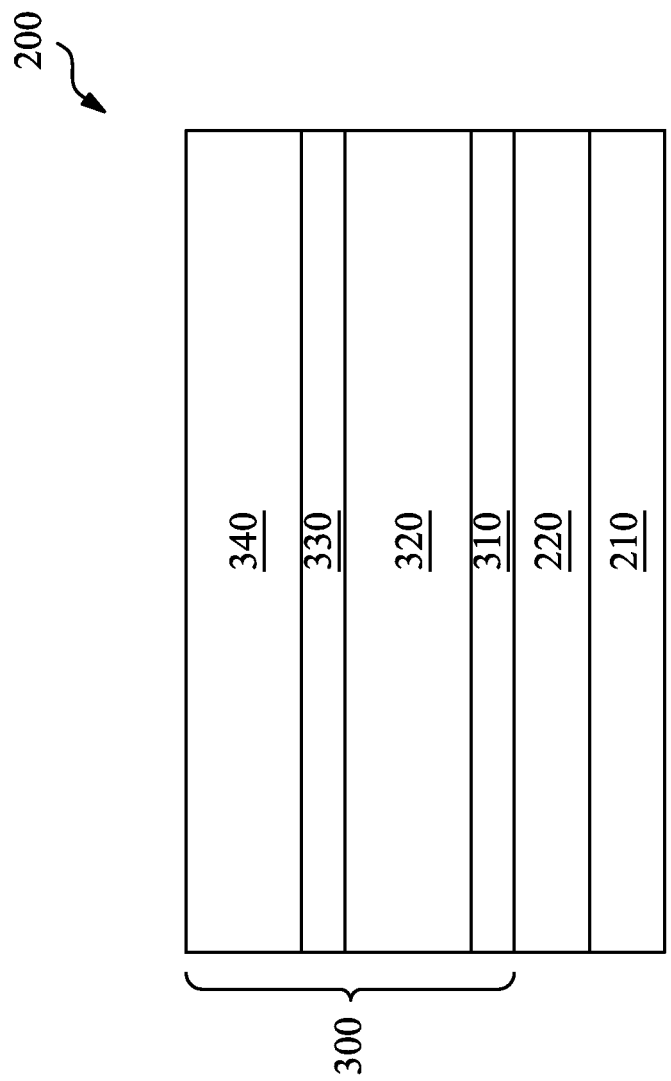
FIG. 2 is a cross section view of an example of a workpiece of a semiconductor device in accordance with some embodiments.

Referring to FIGS. 1 and 2, method 100 begins at step 102 by forming a material layer 220 over a substrate 210 and forming a hard mask (HM) stack 300 over the material layer 220. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various p-type doped regions and/or n-type doped regions, implemented by a process such as ion implantation and/or diffusion. Those doped regions include n-well, p-well, light doped region (LDD), doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, and/or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit.

The material layer 220 may include a dielectric layer, such as silicon oxide, silicon nitride, or silicon oxynitride, low-k dielectric material, and/or other suitable material. The HM stack 300 includes first, second, third and fourth HM layers, 310, 320, 330 and 340, respectively. The HM stack 330 may include silicon oxide, silicon nitride, oxynitride, silicon carbide, titanium oxide, titanium nitride, tantalum oxide, tantalum nitride, and/or any suitable materials. In the present embodiment, to achieve etching selectivity during subsequent etch processes, the second HM layer 320 may include a material which is different from the first HM layer 310, the third HM layer 330 may include a material which is different from the second HM layer 320 and the fourth HM layer 340 may include a material which is different from the third HM layer 330. In an embodiment, the first and third HM layers, 310 and 330, include titanium nitride while the second and fourth HM layers, 320 and 340, include silicon nitride. One or more layers of 220, 310, 320, 330 and 340 may be deposited over by suitable techniques, such as CVD, ALD, PVD, thermal oxidation, combinations thereof, or other suitable techniques.

In the present embodiment, a plurality of features (e.g. trenches) is formed in the material layer 220. Typically, trenches are formed in material layer 220 by forming a hard mask (HM) layer over the material layer 220, then pattern the HM layer and then etch the material layer 220 through the patterned HM layer. It is often that trenches with various lengths are needed. Especially, when device sizes scale down. Typically, a procedure is performed to cut a trench into two sub-trenches, referred to as forming a cut. However, when forming a cut, challenges rise to minimize process-induced-damage on the HM layer. In the present embodiment, method 100 minimizes process-induced-damage on the HM layer 300 while forming a cut.

Figures 3A, 3B:
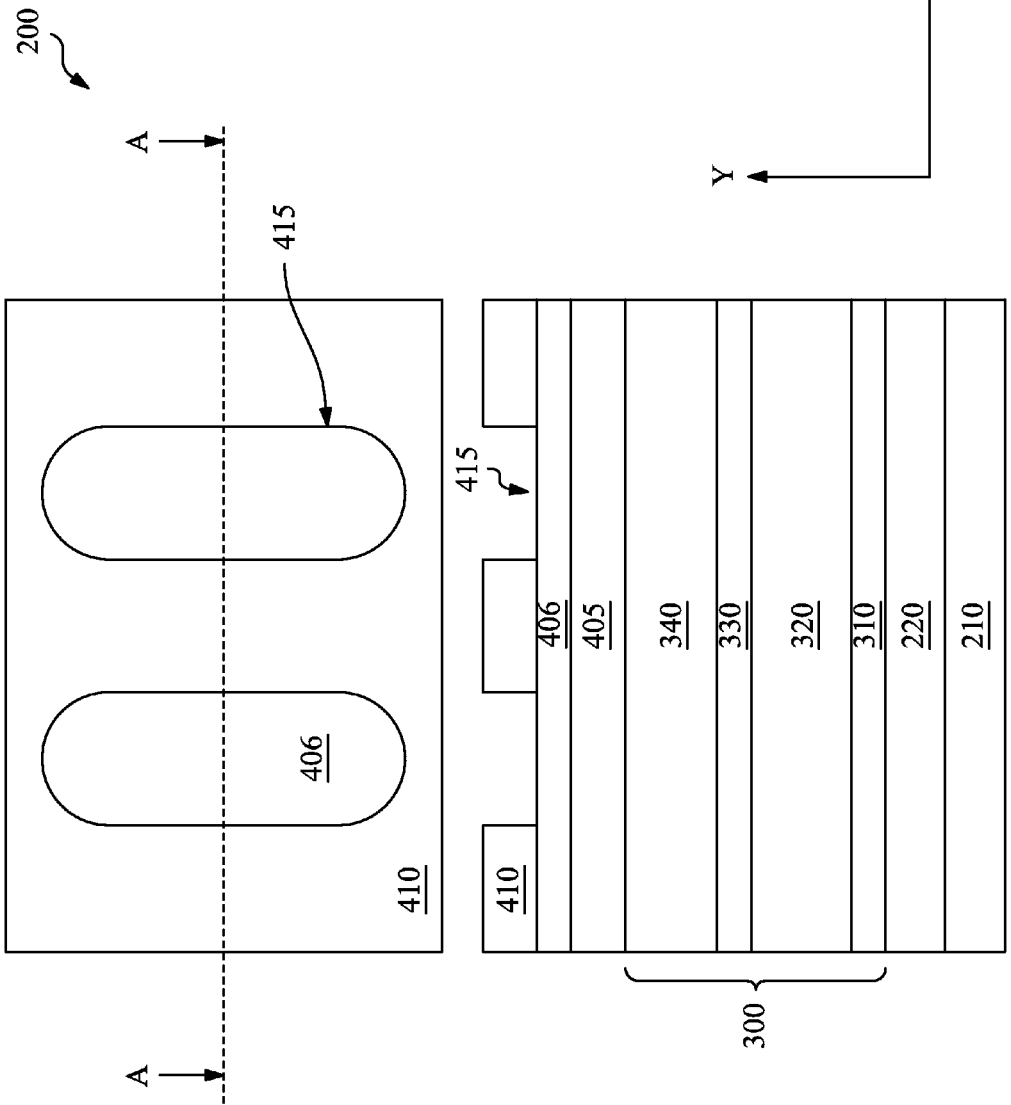

Referring to FIGS. 1, 3A and 3B, method 100 proceeds to step 104 by forming a first patterned resist layer 410 over the fourth HM layer 340. The first patterned resist layer 410 defines a plurality of first line-like openings 415 along a first direction (i.e. Y-direction). Respective portions of the fourth HM layer 340 are exposed in the first line-like openings 415. In some embodiments, the first patterned resist layer 410 is formed by a first lithography process using three layers of material (tri-layer lithography). The three layers are a first bottom layer (BL) 405, a first middle layer (ML) 406, and the first resist layer 410. The first BL layer 405 protects the fourth HM layer 340 in a subsequent etch process. In some embodiments, the first BL layer 405 includes an organic polymer free of silicon. The first ML 406 may include a silicon-containing layer designed to provide etch selectivity from the first BL layer 405. In some embodiments, the first ML 406 is also designed to function as a bottom anti-reflective coating that reduces reflection during a lithography exposure process, thereby increasing the imaging contrast and enhancing the imaging resolution. The first BL 405 is deposited over the fourth HM layer 340, the first ML 406 is deposited over the BL 405, the resist layer 410 is deposited over the first ML 406.

The first resist layer 410 is patterned by the first lithography process to define first line-like openings 415 therein. An exemplary lithography process may include forming a photoresist layer, exposing the photoresist layer by a lithography exposure process, performing a post-exposure bake process, and developing the photoresist layer to form the patterned resist layer.

Figure 4A:
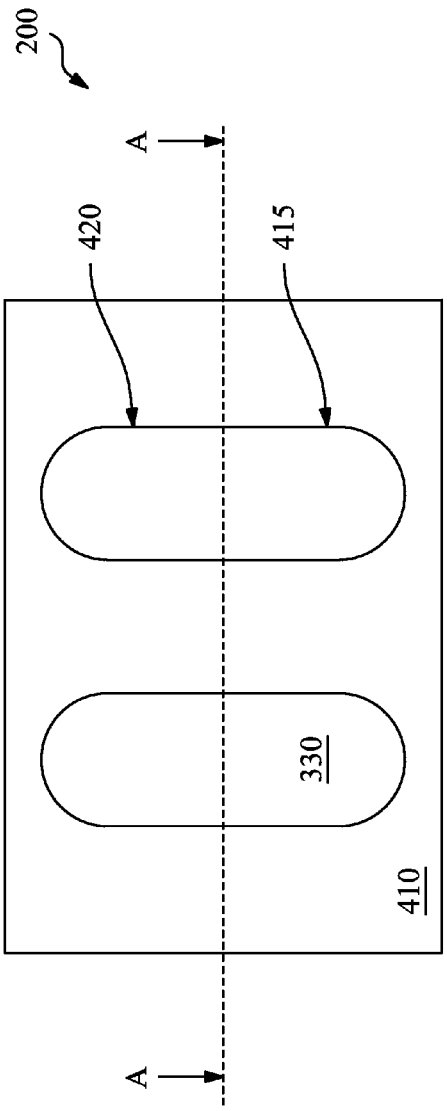
Figure 4B:
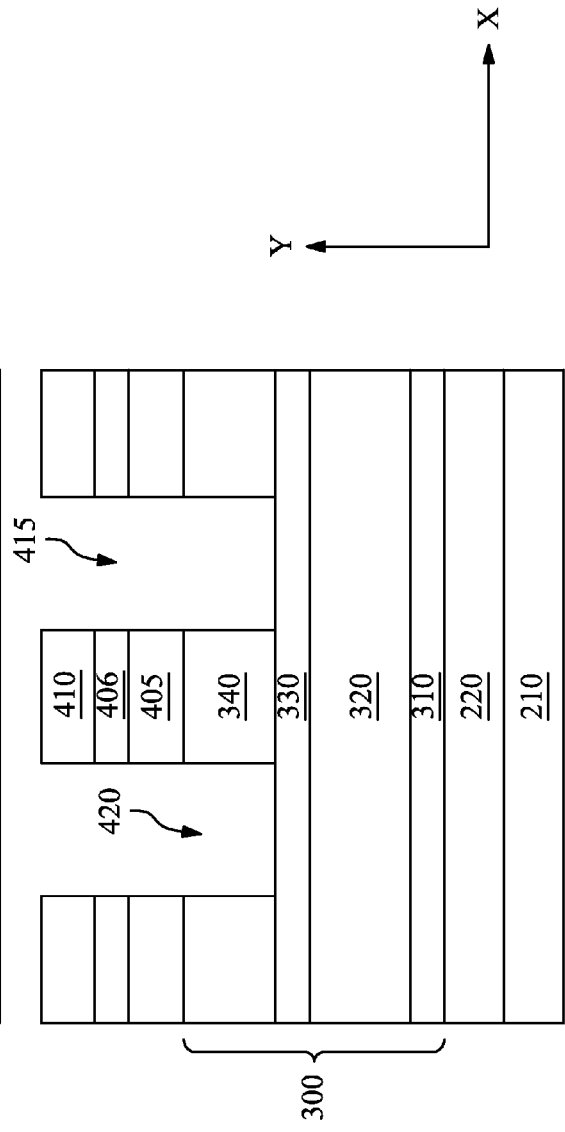
Figure 4C:
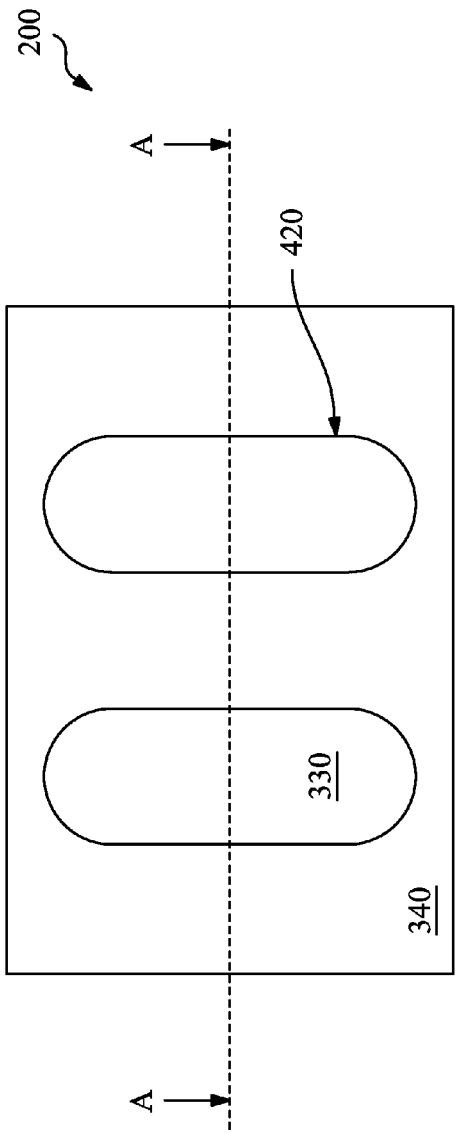
Figure 4D:
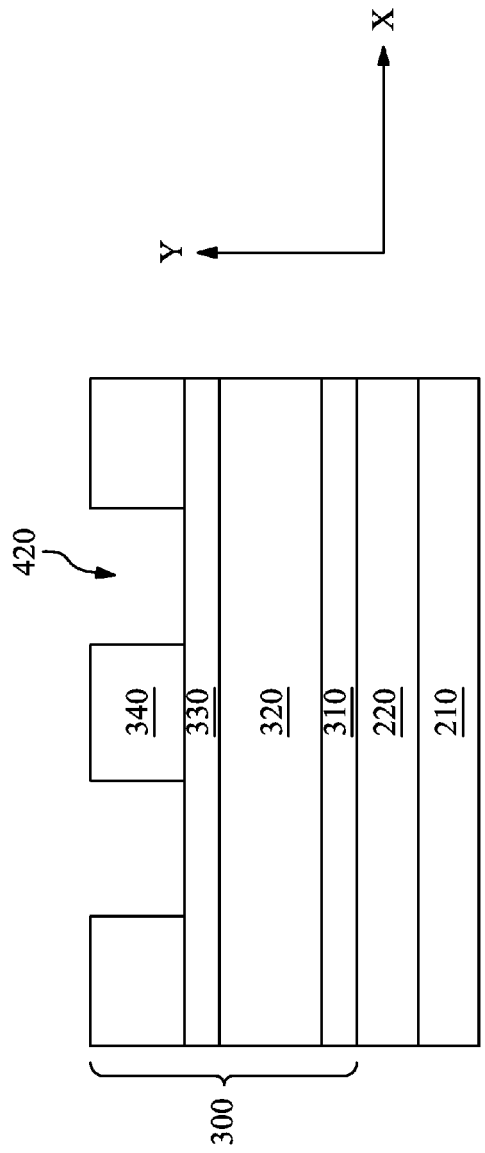

Referring to FIGS. 1, 4A and 4B, method 100 proceeds to step 106 by etching the first ML 406, the first BL 405 and the fourth HM layer 340 through the first line-like openings 415 to form the first trenches 420 in the fourth HM layer 340. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The etch process may include a multiple-step etching to gain etch selectivity, flexibility and desired etch profile. In some embodiments, the etch process is chosen to selectively etch the first ML 406, the first BL 405 and the fourth HM layer 340 without substantially etching the third HM layer 330. As has been mentioned previously, with an adequate etch selectivity, the third HM layer 330 serves as an etch stop layer, which improves etch process window and profile control. After forming first trenches 420, the remaining portions of the first patterned resist layer 410, the first ML 406 and the first BL 405 are removed by another etch process, such as by a wet stripping and/or plasma ashing as shown in FIGS. 4C and 4D.

Figure 5A:
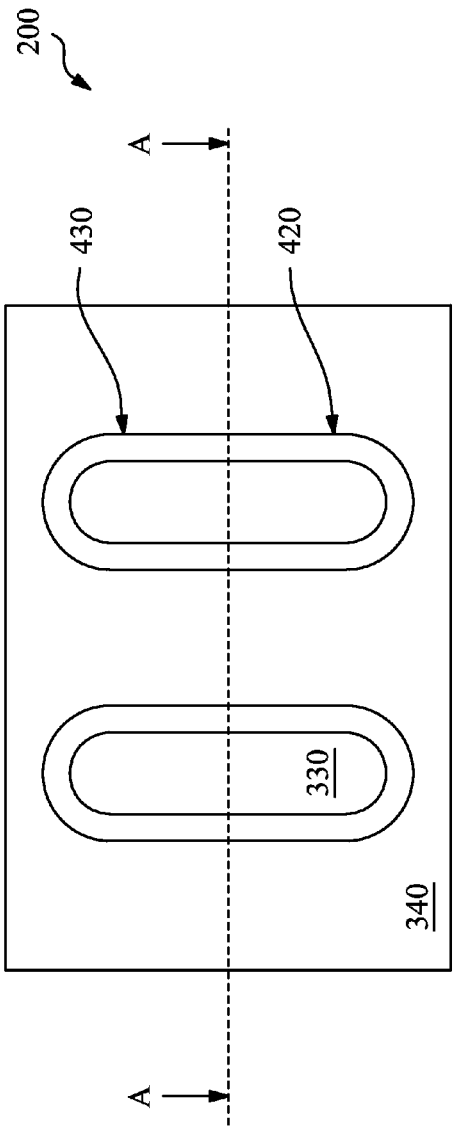
Figure 5B:
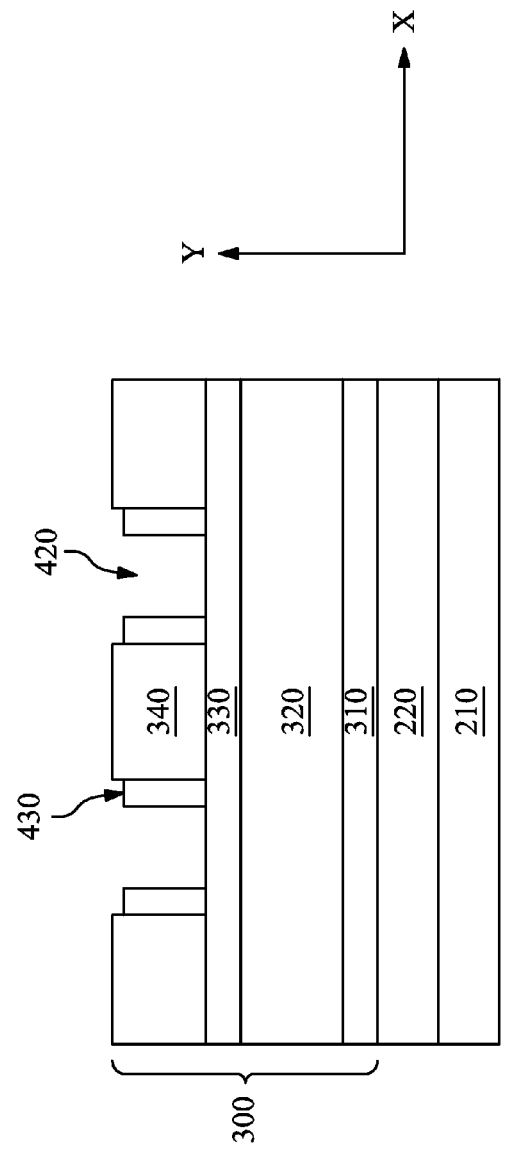

Referring to FIGS. 1, 5A and 5B, method 100 proceeds to step 108 by forming first sidewall spacers 430 along sidewalls of the first trench 420. In the present embodiment, the first sidewall spacers 430 include a material which is different from the fourth HM layer 340 to achieve etching selectivity during subsequent etch. The first sidewall spacers 430 may be formed by depositing a spacer layer over the first trenches 420, and followed by a spacer etch to etch the spacer layer anisotropically. The spacer layer may include silicon oxide, silicon nitride, oxynitride, silicon carbide, titanium oxide, titanium nitride, tantalum oxide, tantalum nitride, and/or any suitable materials. The spacer layer may be deposited by CVD, ALD, PVD, and/or other suitable technique. In an embodiment, the spacer layer is deposited by ALD to achieve conformable film coverage along the sidewalls of the first trenches 420. In an embodiment, the spacer layer is etched by an anisotropic dry etch to form a vertical profile.

Referring to FIGS. 1, 6A and 6B, method 100 proceeds to step 110 by forming a second patterned resist layer 510 over the fourth HM layer 340, including over the first trenches 420. The second patterned resist layer 510 defines a second line-like opening 515 parallel to the first trench 420. A portion of the fourth HM layer 340 is positioned between two adjacent first trenches 420 and is aligned within the second line-like opening 515. In some embodiments, the second patterned resist layer 510 is formed by a second tri-layer lithography. The three layers include a second BL 505, a second ML 506 and the second resist layer 510. The second tri-layer lithography is similar in many respects to the first tri-layer lithography discussed above association with FIGS. 3A and 3B, including the materials discussed therein.

Figure 7C:
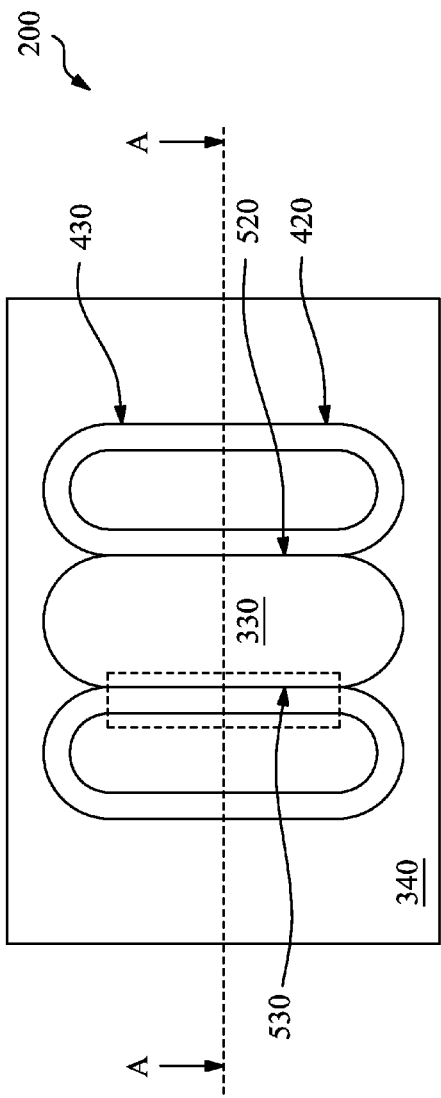
Figure 7D:
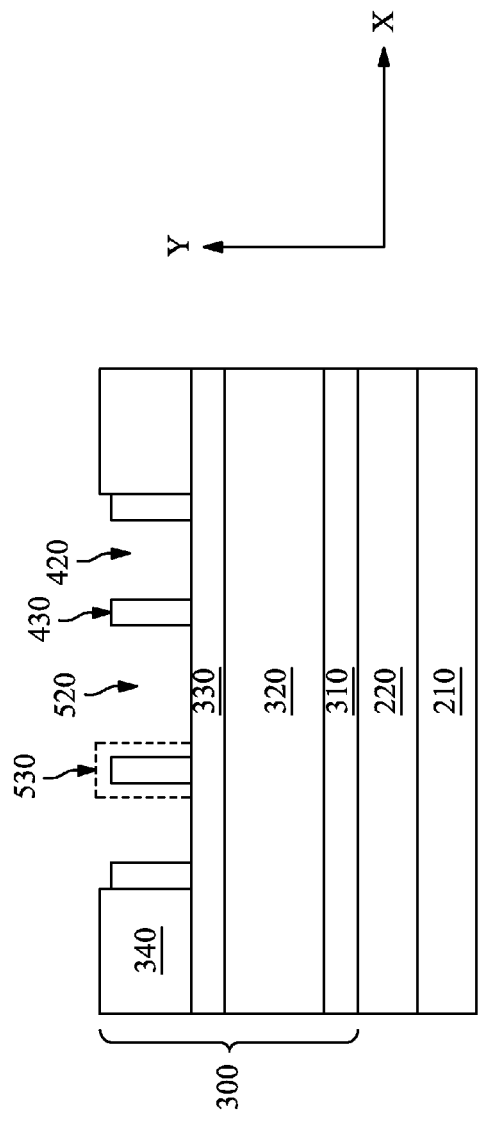

Referring to FIGS. 1, 7A and 7B, method 100 proceeds to step 112 by etching the second ML 506, the second BL 505 and the fourth HM layer 340 through the second line-like openings 515 to form a second trench 520 in the fourth HM layer 340. The etch process is similar in many respects to the etch process discussed above association with FIGS. 4A-4B. After forming second trenches 520, the remaining portions of the second patterned resist layer 510, the second ML 506 and the second BL 505 are removed by another etch process, such as by a wet stripping and/or plasma ashing, as shown in FIGS. 7C and 7D. As a result, the first sidewall spacers 430 shared by the first and second trenches, 420 and 520, form first line-like features 530 along the first direction (i.e. Y-direction) and parallel to each other.

Figures 8A, 8B:
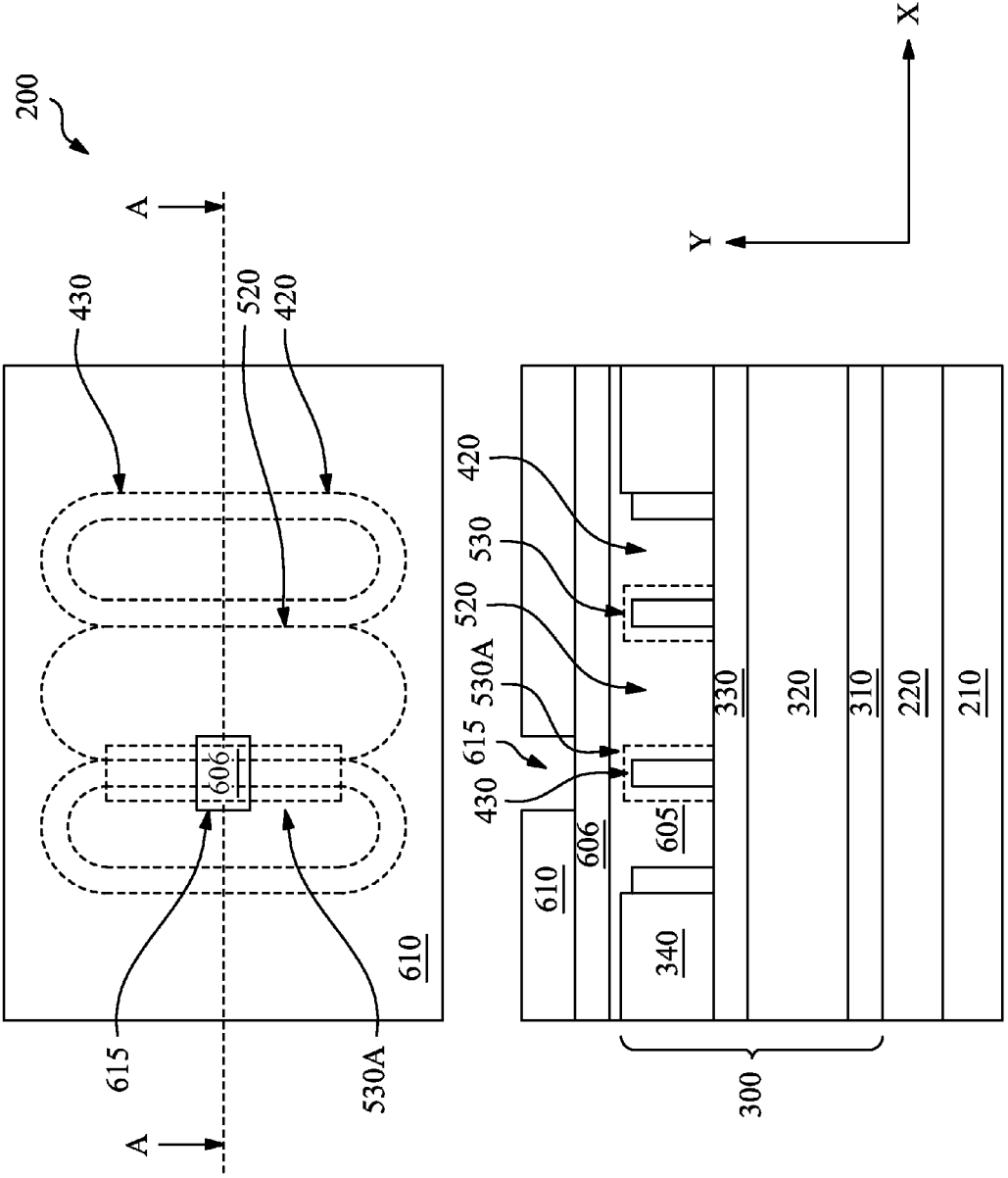

Referring to FIGS. 1, 8A and 8B, method 100 proceeds to step 114 by forming a third patterned resist layer 610 over the fourth HM layer 340 and the first line-like features 530. The third patterned resist layer 610 defines a first cut opening 615, which overlaps a designated first line-like feature 530, now labeling it with the reference number 530A. In some embodiments, the third patterned resist layer 610 is formed by a third tri-layer lithography. The three layers include a third BL 605, a third ML 606 and the third resist layer 610. The third tri-layer lithography is similar in many respects to the first tri-layer lithography discussed above association with FIGS. 3A and 3B, including the materials discussed therein.

Figures 9A, 9B:
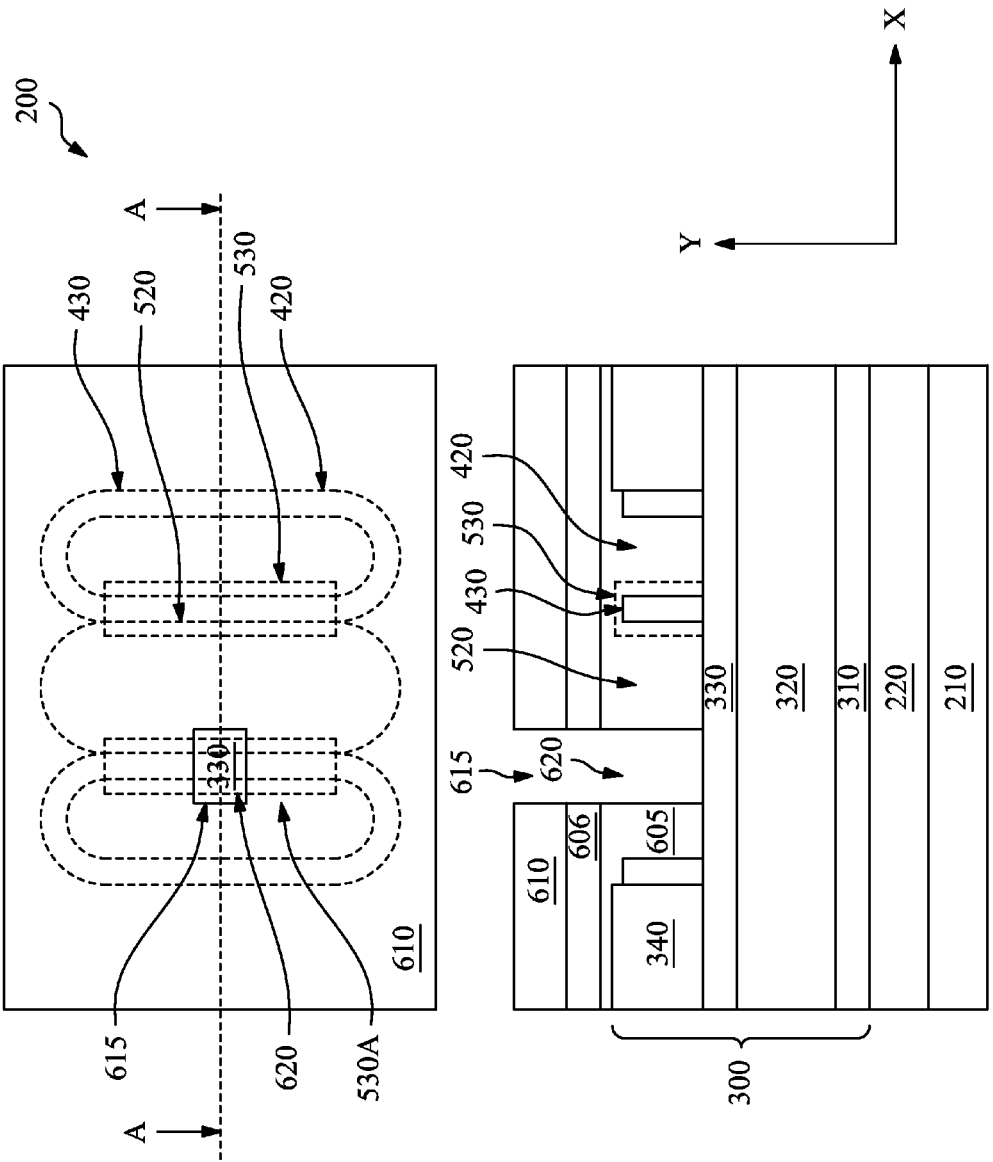

Referring to FIGS. 1, 9A and 9B, method 100 proceeds to step 116 by etching the third ML 406, the third BL 605 and a portion of the first line-like feature 530A through the first cut opening 615 to form a first cut 620. The etch process may include a wet etch, a dry etch, and/or a combination thereof. In some embodiments, the etch process is chosen to selectively etch the first line-like feature 530 without substantially etching the third HM layer 330 such that the third HM layer 330 serves as an etch stop layer. Therefore, by being protected by the third HM layer 330, the second and first HM layers, 320 and 310, remain intact during forming the first cut 620. It is important for the first HM layer 310, which will be the HM layer to define features to be formed over the material layer 220, to minimize process-induced-damage such as non-uniform thickness loss during the etch process of forming the first cut 620.

Figure 9C:
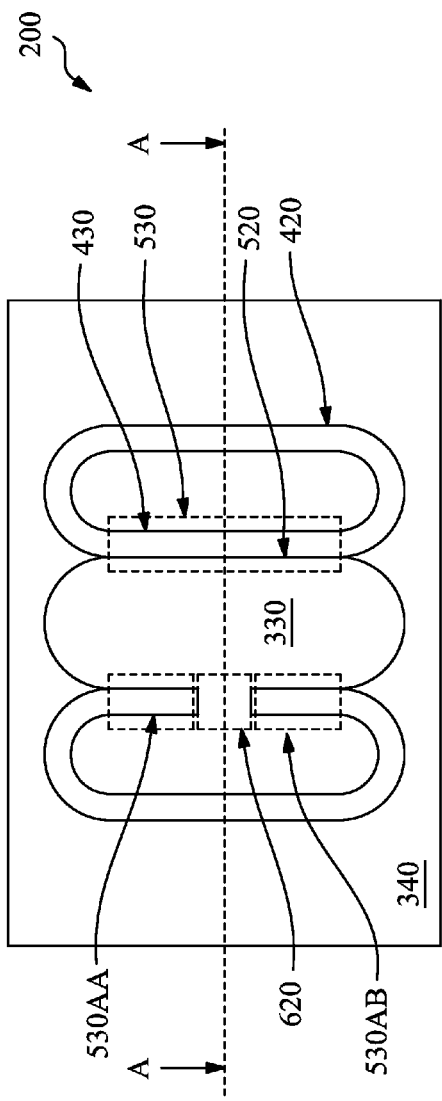
Figure 9D:
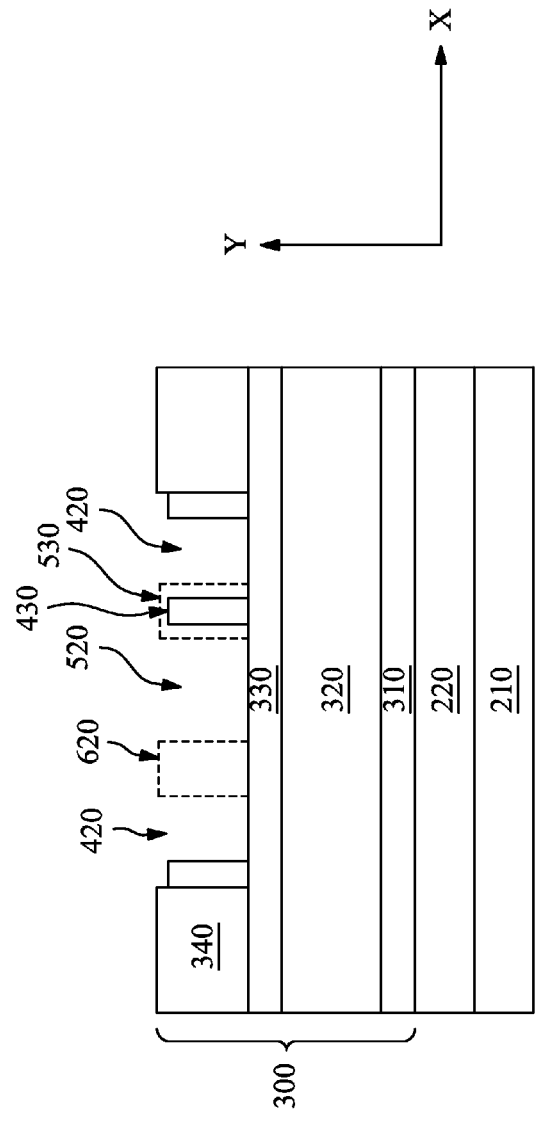

After forming the first cut 620, the remaining portions of the third patterned resist layer 610, the third ML 606 and the third BL 605 are removed by another etch process, such as by a wet stripping and/or plasma ashing, as shown in FIGS. 9C and 9D. As a result, the first line-like feature 530A is cut into two first sub-line-like features, 530AA and 530AB.

Referring to FIGS. 1, 10A and 10B, method 100 proceeds to step 118 by extending the first and second trenches, 420 and 520, and the first cut 620 into the second HM layer 320 by using the first sidewall spacers 430 and the fourth HM layer 340 as an etch mask. With first sidewall spacers 430, the extended first trenches 420' are formed with a smaller width than the first trench 420. Portions of the second HM layer 320 underneath the first sidewall spacers 430 remains intact and it forms extended first sidewall spacers 430' (including extended first line-like features 530', 530AA' and 530AB', respectively). The second trench 520 is extended to an extended second trench 520' and the first cut 620 extended to an extended first cut 620'.

The etch process may include a wet etch, a dry etch, and/or a combination thereof. In the present embodiment, the etch process is chosen to selectively etch the third and the second HM layers 330 and 320 without substantially etching the first sidewall spacers 430, the fourth HM layer 340 and the first HM layer 310. As a result, the first HM layer 310 serves as an etch stop layer, which improves etch process window and profile control.

Figure 11A:
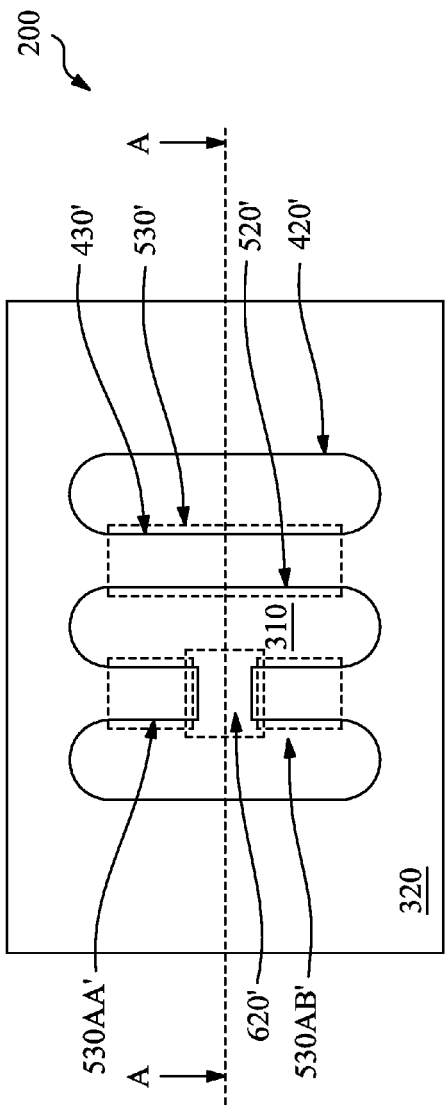
Figure 11B:
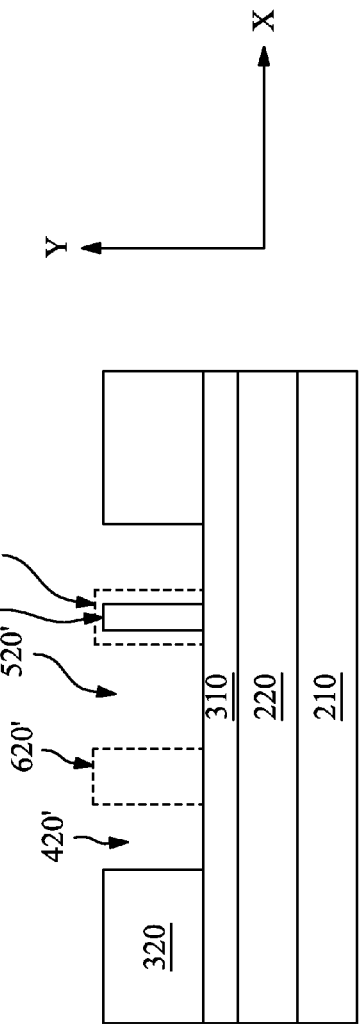

Referring to FIGS. 1, 11A and 11B, method 100 proceeds to step 120 by removing the remaining portions of the fourth and the third HM layers, 340 and 330, and the first sidewall spacers 430. The etch process may include a wet etch, a dry etch, and/or a combination thereof. In some embodiments, the etch process is chosen to selectively remove the fourth and the third HM layers, 340 and 330, and the first sidewall spacers 430 without substantially etching the second and the first HM layers 320 and 310. As a result, the extended first trench 420', the extended second trenches 520', the extended first sidewall spacers 430' (including extended first line-like features 530', 530AA' and 530AB') and the extended first cut 620' are formed in the second HM layer 320.

Figure 12A:
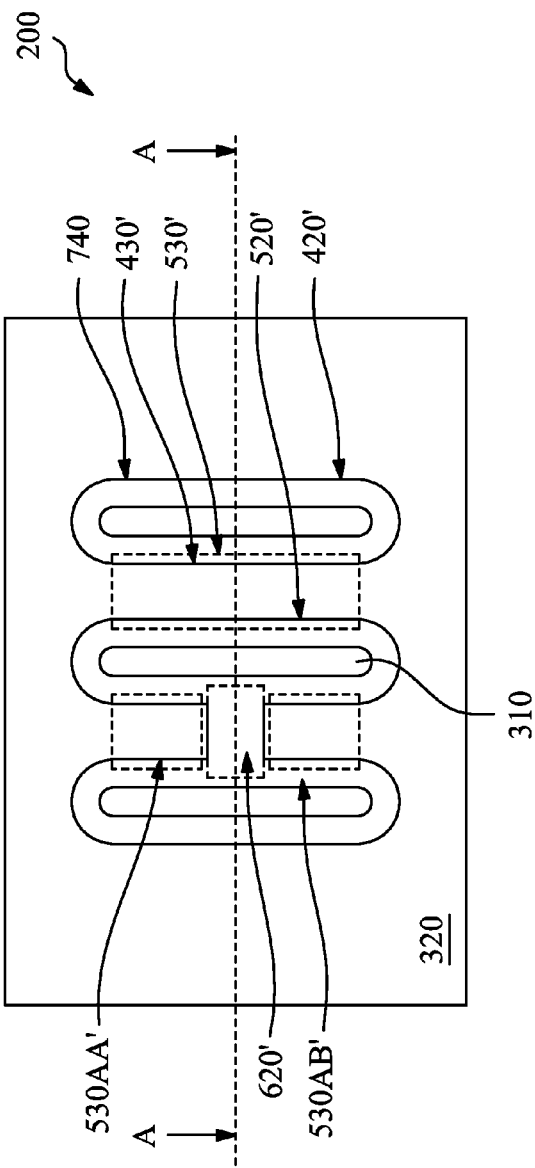
Figure 12B:
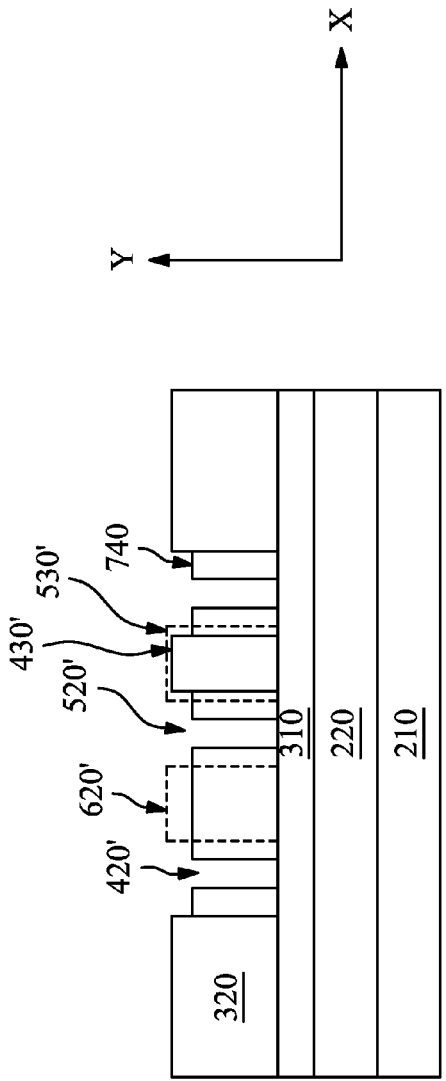

Referring to FIGS. 1, 12A and 12B, method 100 proceeds to step 122 by forming second sidewall spacers 740 along sidewalls of the extended first trench 420' and the extended second trenches 520', including along sidewalls of the extended first spacer 430'. In the present embodiment, the second sidewall spacers 740 are formed such that the extended first cut 620' is filled by the second sidewall spacers 740 as well. In some embodiments, the second sidewall spacers 740 are formed similarly in many respects to the first sidewall spacers 430 discussed above association with FIGS. 5A and 5B. In the present embodiment, the second sidewall spacers 740 include a material which is different from the second HM layer 320 to achieve etching selectivity during subsequent etch.

Referring to FIGS. 1, 13A and 13B, method of 100 proceeds to step 124 by forming a fourth patterned resist layer 810 over the first HM layers 310, the second HM layer 320 and the second sidewall spacers 740. The fourth patterned resist layer 810 defines a second cut opening 815. In the present embodiment, the second cut opening 815 has a rectangular shape such that the extended first line-like features 530', 530AA' and 530AB', the extended first cut 620' are aligned within the second cut opening 815. Additionally, edges of the second cut opening 815 along the first direction (i.e. Y direction) align to a middle of the second sidewall spacers 740.

In some embodiments, the fourth patterned resist layer 810 is formed by a fourth tri-layer lithography. The three layers are a fourth BL 805, a fourth ML 806 and the fourth resist layer 810. The fourth tri-layer lithography is similar in many respects to the first tri-layer lithography discussed above association with FIGS. 3A and 3B, including the materials discussed therein.

Figure 14A:
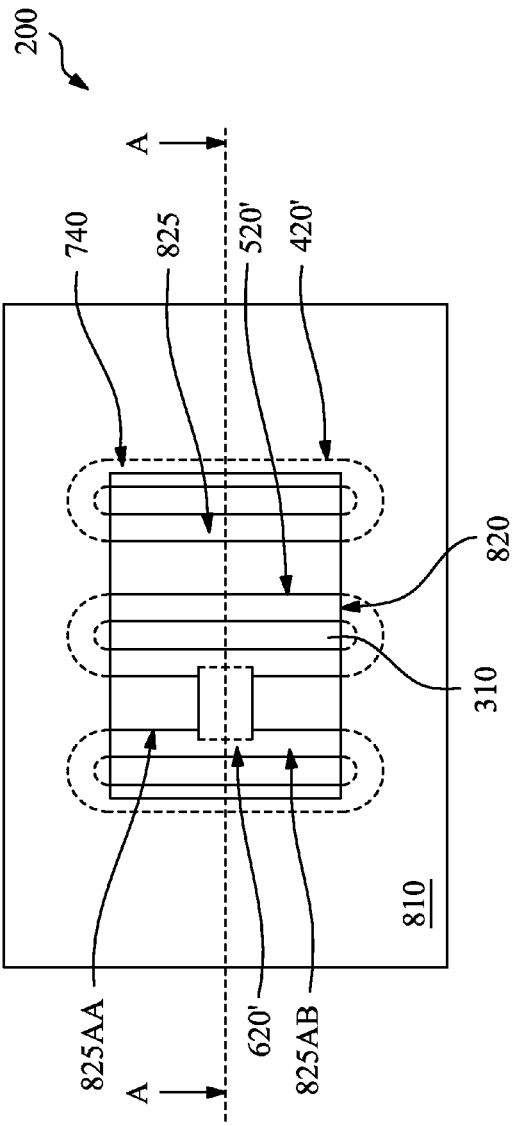
Figure 14B:
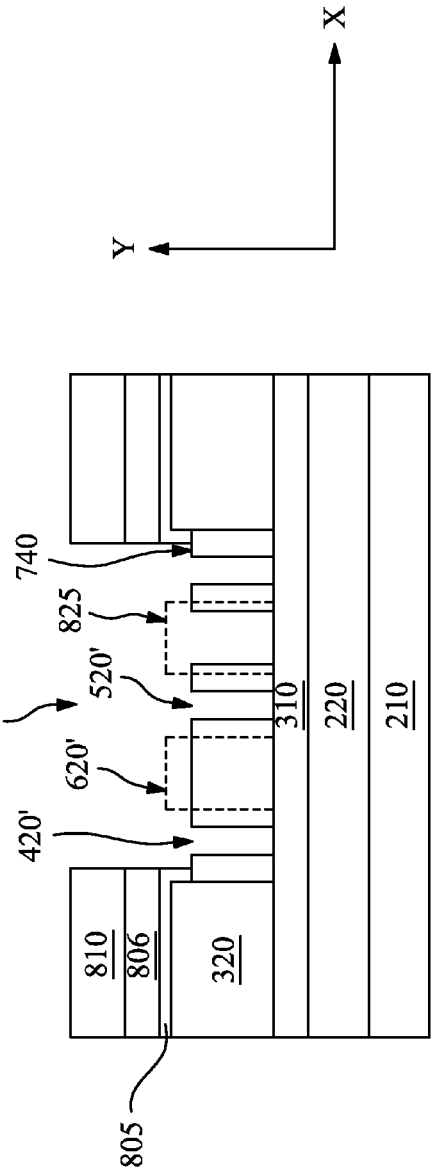

Referring to FIGS. 1, 14A and 14B, method of 100 proceeds to step 126 by etching the extended first line-like features 530', 530AA' and 530AB' (made by the second HM layer 320) through the second cut opening 815 to form third trenches 825, 825AA and 825AB, respectively within a second cut 820. The etch process may include a wet etch, a dry etch, and/or a combination thereof. In some embodiments, the etch process is chosen to selectively etch the second HM layer 320 without substantially etching the second sidewall spacers 740 and the first HM layer 310 such that the second spacers 740 serve as sub-etch masks and the first HM layer 310 serves as an etch stop layer. The extended first cut 620' filled with the second sidewall spacers 740 remains intact during the etch process.

Figure 14C:
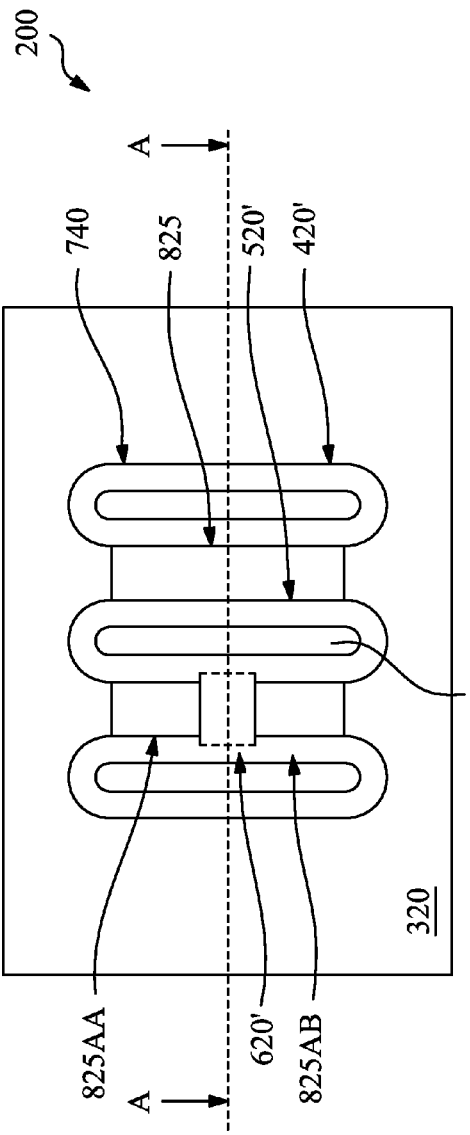
Figure 14D:
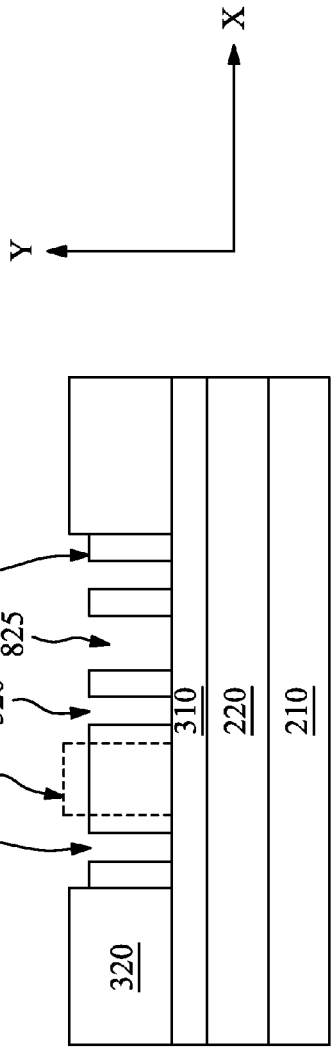

After forming the second cut 820, the remaining portions of the fourth patterned resist layer 810, the fourth ML 806 and the fourth BL 805 are removed by another etch process, such as by a wet stripping and/or plasma ashing, as shown FIGS. 14C and 14D. As a result, the first HM layer 310 is exposed with in the extended first trench 420', the extended second trench 520', and the third trenches, 825, 825AA and 825AB.

Figure 15A:
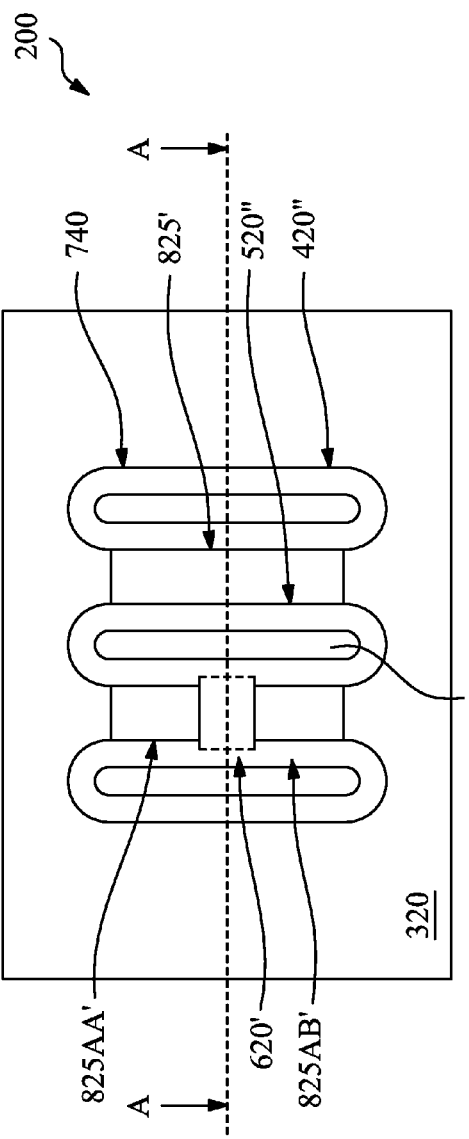
Figure 15B:
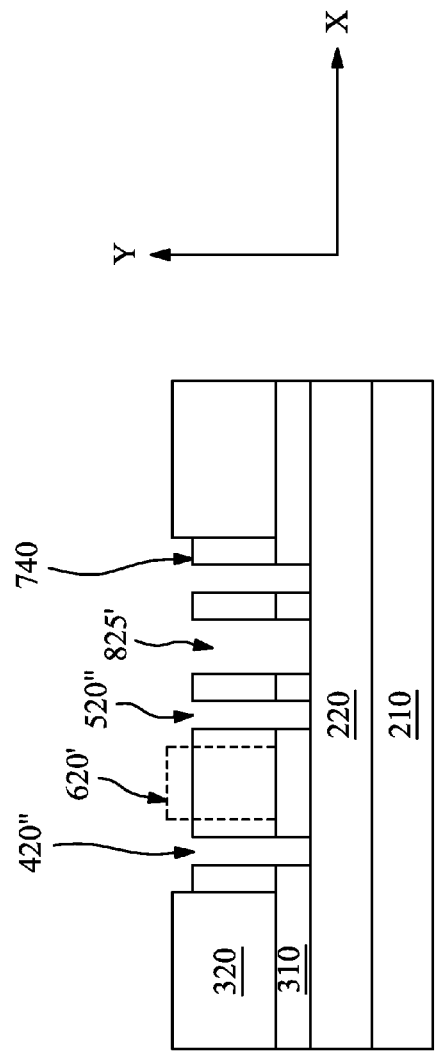

Referring to FIGS. 1, 15A and 15B, method of 100 proceeds to step 128 by etching exposed the first HM layer 310 to extend the extended first trench 420', extended second trench 520' and the third trenches, 825, 825AA and 825AB into the first HM layer 310. As a result, the extended first trench 420' extends to a further extended first trench 420", the extended second trench 520 is extended further to form a further extended second trench 520" and the third trenches, 825, 825AA and 825AB extend to extended the third trenches 825', 825AA' and 825AB', respectively. The etch process may include a wet etch, a dry etch, and/or a combination thereof. In some embodiments, the etch process is chosen to selectively etch the HM layers 310 without substantially etching the second HM layers 320 and second sidewall spacers 740. As a result, the second HM layers 320 and the second sidewall spacers 740 serve as an etch mask.

Figures 15C, 15D:
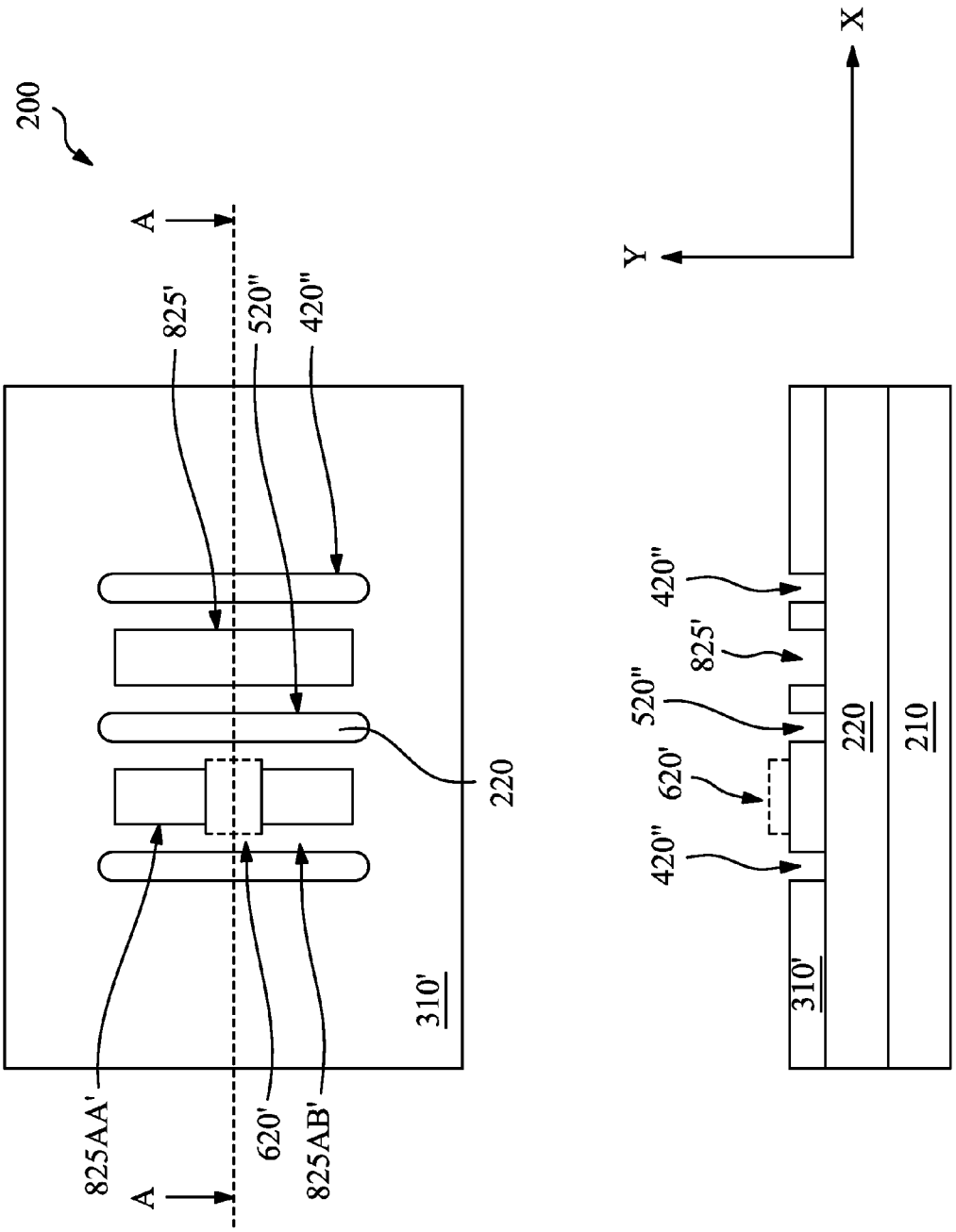

After etching the exposed the first HM layer 310, the second HM layer 320 and the second sidewall spacers 740 are removed by another etch process, such as by a wet stripping and/or plasma ashing, as shown FIGS. 15C and 15D. As a result, the further extended first trench 420", the further extended second trench 520" and the third trenches, 825', 825AA' and 825AB' are transferred to the first HM layer 310 to form a patterned first HM layer 310'. As shown, the extended third trench 825AA' aligns to the extended third trench 825AB' and apart away by the extended first cut 620'.

Referring to FIGS. 1, 16A and 16B, method of 100 proceeds to step 130 by etching the material layer 220 by using the patterned first HM layer 310' as an etch mask to transfer the further extended first trench 420", the further extended second trench 520" and the extended third trenches, 825', 825AA' and 825AB' into the material layer 220. The etch process may include a wet etch, a dry etch, and/or a combination thereof.

Additional steps can be provided before, during, and after method 100 and some of the steps described can be replaced, eliminated, and/or moved around for additional embodiments of method 100. Other alternatives or embodiments may present without departure from the spirit and scope of the present disclosure.

Based on the above, it can be seen that the present disclosure provides methods of forming a trench cut. The method employs a hard mask stack to form a cut at top two HM layers and avoid the bottom HM layer to expose to the etch process of the trench cut formation. The method demonstrates a robust process for forming trench and trench cut with improved process window control.

The present disclosure provides many different embodiments of fabricating a semiconductor device that provide one or more improvements over existing approaches. In an embodiment, a method for fabricating a semiconductor device includes forming a hard mask (HM) stack over a material layer. The HM stack includes a first HM layer disposed over the material layer, a second HM layer disposed over the first HM layer, a third HM layer disposed over the second HM layer and a fourth HM layer disposed over the third HM layer. The method also includes forming a first trench in the fourth HM layer, forming a first spacer in the first trench, removing the fourth HM layer adjacent to the first spacer to form a second trench, removing at least a portion of the first spacer to form a cut by using the third HM layer as an etch-stop layer, removing a portion of the third HM layer and the second HM layer exposed by the first trench, second trench, and cut to form an extended first trench, extended second trench, and extended cut, respectively. The method also includes forming second spacers in the extended first trench, the extended second trench, and the extended cut, removing another portion of the second HM layer to form a third trench and removing a portion of the first HM layer exposed by the extended first trench, extended second trench, extended cut, and third trench, respectively.

In another embodiment, a method includes forming a hard mask (HM) stack over a material layer. The HM stack includes a first HM layer disposed over the material layer, a second HM layer disposed over the first HM layer, a third HM layer disposed over the second HM layer and a fourth HM layer disposed over the third HM layer. The method also includes forming a first trench in the fourth HM layer, forming a first spacer along a sidewall of the first trench, forming a second trench in the fourth HM layer such that the first spacer is disposed between the first and second trenches and cutting the first spacer between the first trench and the second trench to form a cut by using the third HM layer as an etch-stop layer.

In yet another embodiment, a device includes forming a first hard mask (HM) layer over a material layer, forming a second HM layer over the first HM layer. The second HM layer has a different etch selectivity than the first HM layer. The method also includes forming a third HM layer over the second HM layer. The third HM layer has a different etch selectivity than the second HM layer. The method also includes forming a fourth HM layer over the third HM layer. The forth HM layer has a different etch selectivity than the third HM layer. The method also includes forming a plurality of first trenches in the fourth HM layer, forming first spacers along sidewalls of the plurality of first trenches, forming a second trench in the fourth HM layer, cutting one of the first spacers to form a cut by using the third HM layer as an etch-stop layer, etching the second HM layer through the plurality of first trenches, the second trench, and the cut to form an extended first trenches, an extended second trench, and an extended cut, respectively. The method also includes forming second spacers along sidewalls of the extended first trenches, the extended second trench and the extended cut, etching the second HM layer between two adjacent second spacers to form a third trench, etching the first HM layer through the extended first trench, the extended second trench and the third trench to form a patterned first HM layer and etching the material layer by using the patterned first HM layer as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a hard mask (HM) stack over a material layer, wherein the HM stack includes a first HM layer disposed over the material layer, a second HM layer disposed over the first HM layer, a third HM layer disposed over the second HM layer and a fourth HM layer disposed over the third HM layer;
   forming a first trench in the fourth HM layer;
   forming a first spacer in the first trench;
   removing the fourth HM layer adjacent to the first spacer to form a second trench;
   removing at least a portion of the first spacer to form a cut by using the third HM layer as an etch-stop layer;
   removing a portion of the third HM layer and the second HM layer exposed by the first trench, second trench, and cut to form an extended first trench, extended second trench, and extended cut, respectively;
   forming second spacers in the extended first trench, the extended second trench, and the extended cut;
   removing another portion of the second HM layer to form a third trench; and
   removing a portion of the first HM layer exposed by the extended first trench, extended second trench, extended cut, and third trench, respectively.

2. The method of claim 1, further comprising:
   after removing the portion of the first HM layer exposed by the extended first trench, extended second trench, extended cut, and third trench, respectively, etching the material layer by using the first HM layer as an etch mask.

3. The method of claim 1, wherein removing the fourth HM layer adjacent to the first spacer to form the second trench includes:
   forming a patterned resist layer over the fourth HM layer, wherein the patterned resist layer defines an opening;
   selectively etching the fourth HM layer through the opening; and
   removing the patterned resist layer.

4. The method of claim 1, wherein removing at least the portion of the first spacer to form the cut includes:
   forming a patterned resist layer over the first spacer, wherein the patterned resist layer defines an opening;
   etching the first spacer through the opening; and
   removing the patterned resist layer.

5. The method of claim 1, wherein removing the portion of the third HM layer and the second HM layer exposed by the first trench, second trench, and cut includes:
   selectively etching through the third HM layer and the second HM layer by using the fourth HM layer as an etch mask.

6. The method of claim 1, wherein removing another portion of the second HM layer to form the third trench includes:
   forming a patterned resist layer over the second HM layer, wherein the patterned resist layer defines an opening;
   etching the second HM layer through the opening; and
   removing the patterned resist layer.

7. The method of claim 6, wherein the cut filled with the second spacers is within the opening, wherein the cut is protected by second spacers during etching the second HM layer through the opening.

8. The method of claim 1, wherein removing the portion of the first HM layer includes selectively etching the first HM layer through the extended first trench, the extended second trench and the third trench by using the second HM layer and the second spacer as an etch mask.

9. The method of claim 1, wherein forming the HM stack over the material layer includes:
   depositing the first HM layer over the material layer;
   depositing the second HM layer over the first HM layer, wherein the second HM layer has a different etch selectivity than the first HM layer;
   depositing the third HM layer over the second HM layer, wherein the third HM layer has a different etch selectivity than the second HM layer; and
   depositing the fourth HM layer over the third HM layer, wherein the forth HM layer has a different etch selectivity than the third HM layer.

10. A method comprising:
    forming a hard mask (HM) stack over a material layer, wherein the HM stack includes a first HM layer disposed over the material layer, a second HM layer disposed over the first HM layer, a third HM layer disposed over the second HM layer and a fourth HM layer disposed over the third HM layer;
    forming a first trench in the fourth HM layer;
    forming a first spacer along a sidewall of the first trench;
    forming a second trench in the fourth HM layer such that the first spacer is disposed between the first and second trenches; and
    cutting the first spacer between the first trench and the second trench to form a cut by using the third HM layer as an etch-stop layer.

11. The method of claim 10, wherein forming the second trench in the fourth HM layer includes:
    forming a patterned resist layer over the fourth HM layer, wherein the patterned resist layer defines an opening;
    selectively etching the fourth HM layer through the opening; and
    removing the patterned resist layer.

12. The method of claim 10, wherein cutting the first spacer between the first trench and the second trench to form the cut includes:
    forming a patterned resist layer over the fourth HM layer, wherein the patterned resist layer defines an opening;
    etching the fourth HM layer through the opening; and
    removing the patterned resist layer.

13. The method of claim 10, further comprising:
    etching the second HM layer through the first trench, the second trench, and the cut to form an extended first trench, an extended second trench, and an extended;
    forming second spacers along sidewalls of the extended first trench, the extended second trench and the extended cut;
    etching the second HM layer to form a third trench; and
    etching the first HM layer through the extended first trench, the extended second trench and the third trench to pattern the first HM layer; and
    etching the material layer by using the patterned first HM layer as an etch mask.

14. The method of claim 13, wherein etching the second HM layer through the first trench, the second trench, and the cut includes selectively etching through the third HM layer and the second HM layer by using the first spacer and the fourth HM layer as an etch mask.

15. The method of claim 13, wherein etching the second HM layer to form the third trench includes:

forming a patterned resist layer over the second HM layer, wherein the patterned resist layer defines an opening;

etching the second HM layer through the opening; and removing the patterned resist layer.

16. The method of claim 13, wherein etching the first HM layer through the extended first trench, the extended second trench and the third trench includes selectively etching the first HM layer through the extended first trench, the extended second trench and the third trench by using the second HM layer and the second spacer as an etch mask.

17. The method of claim 10, wherein forming the HM stack over the material layer includes:

depositing the first HM layer over the material layer;

depositing the second HM layer over the first HM layer, wherein the second HM layer has a different etch selectivity than the first HM layer;

depositing the third HM layer over the second HM layer, wherein the third HM layer has a different etch selectivity than the second HM layer; and depositing the fourth HM layer over the third HM layer, wherein the forth HM layer has a different etch selectivity than the third HM layer.

18. A method comprising:

forming a first hard mask (HM) layer over a material layer;

forming a second HM layer over the first HM layer, wherein the second HM layer has a different etch selectivity than the first HM layer;

forming a third HM layer over the second HM layer, wherein the third HM layer has a different etch selectivity than the second HM layer;

forming a fourth HM layer over the third HM layer, wherein the forth HM layer has a different etch selectivity than the third HM layer;

forming a plurality of first trenches in the fourth HM layer;

forming first spacers along sidewalls of the plurality of first trenches;

forming a second trench in the fourth HM layer;

cutting one of the first spacers to form a cut by using the third HM layer as an etch-stop layer;

etching the second HM layer through the plurality of first trenches, the second trench, and the cut to form an extended first trenches, an extended second trench, and an extended cut, respectively;

forming second spacers along sidewalls of the extended first trenches, the extended second trench and the extended cut;

etching the second HM layer between two adjacent second spacers to form a third trench;

etching the first HM layer through the extended first trench, the extended second trench and the third trench to form a patterned first HM layer; and etching the material layer by using the patterned first HM layer as an etch mask.

19. The method of claim 18, wherein forming the second trench in the fourth HM layer includes:

forming a patterned resist layer over the fourth HM layer, wherein the patterned resist layer defines an opening;

selectively etching the fourth HM layer through the opening; and removing the patterned resist layer.

20. The method of claim 18, wherein cutting one of the first spacers to form the cut by using the third HM layer as an etch-stop layer includes:

forming a patterned resist layer over the fourth HM layer, wherein the patterned resist layer defines an opening;

etching the fourth HM layer through the opening; and removing the patterned resist layer.

* * * * *